(12) United States Patent
Zhang et al.

(10) Patent No.: US 6,630,433 B2
(45) Date of Patent: Oct. 7, 2003

(54) COMPOSITION FOR CHEMICAL MECHANICAL PLANARIZATION OF COPPER, TANTALUM AND TANTALUM NITRIDE

(75) Inventors: Fan Zhang, San Jose, CA (US); Daniel L. Towery, Santa Clara, CA (US); Joseph A. Levert, Santa Clara, CA (US); Shyama P. Mukherjee, Morgan Hill, CA (US)

(73) Assignee: Honeywell International Inc., Morristown, NJ (US)

( * ) Notice: Subject to any disclaimer, the term of this patent is extended or adjusted under 35 U.S.C. 154(b) by 72 days.

(21) Appl. No.: 09/745,266

(22) Filed: Dec. 20, 2000

(65) Prior Publication Data

US 2002/0020833 A1 Feb. 21, 2002

Related U.S. Application Data

(63) Continuation-in-part of application No. 09/357,264, filed on Jul. 19, 1999.

(51) Int. Cl.$^7$ .................. C11D 7/08; H01L 21/302
(52) U.S. Cl. ............... 510/175; 252/79.4; 438/693
(58) Field of Search .................. 510/175, 176, 510/177; 438/693; 252/79.4

(56) References Cited

U.S. PATENT DOCUMENTS 5,993,686 A * 11/1999 Streinz et al.
6,136,711 A * 10/2000 Grumbine et al.

* cited by examiner

Primary Examiner—Gregory E. Webb
(74) Attorney, Agent, or Firm—Riordan & McKinzie; Sandra P. Thompson

(57) ABSTRACT

Chemical mechanical planarization or spin etch planarization of surfaces of copper, tantalum and tantalum nitride is accomplished by means of the chemical formulations of the present invention. The chemical formulations may optionally include abrasive particles and which may be chemically reactive or inert. Contact or non-contact CMP may be performed with the present chemical formulations. Substantially 1:1 removal rate selectivity for Cu and Ta/TaN is achieved.

8 Claims, 1 Drawing Sheet

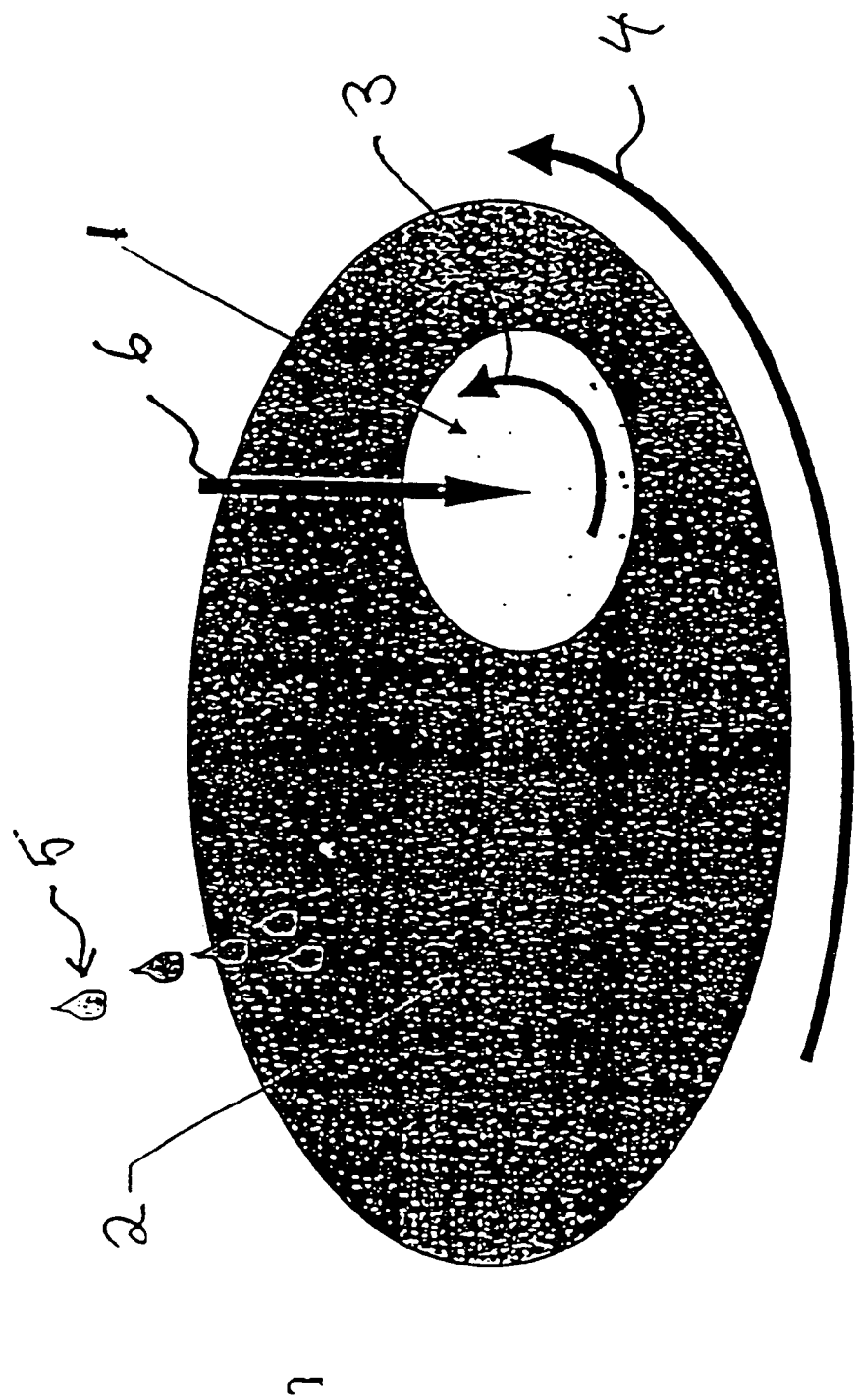

COMPOSITION FOR CHEMICAL MECHANICAL PLANARIZATION OF COPPER, TANTALUM AND TANTALUM NITRIDE

RELATED APPLICATIONS

The present application is filed pursuant to 37 C.F.R. §1.53(b) as a continuation-in-part of application Ser. No. 09/357,264, filed Jul. 19, 1999, and claims priority therefrom as to subject matter commonly disclosed pursuant to 35 U.S.C §120 and 37 C.F.R. §1.78.

BACKGROUND OF THE INVENTION

1. Technical Field

This invention relates to chemical mechanical processes for the planarization of surfaces, and to chemical compositions especially suited thereto. More particularly, this invention relates to compositions for the chemical mechanical planarization of conductive, barrier and dielectric surfaces as typically encountered in the fabrication of integrated circuits, including compositions specifically formulated for chemical mechanical planarization and non-contact chemical planarization of Cu/Ta/TaN.

2. Description of Related Art

Fabrication of integrated circuits ("ICs") to improve performance and reduce costs involves complex analysis of materials properties, processing technology and IC design. IC's consist of multiple layers of conducting, insulating and semiconductor materials, interconnected in various ways by conducting metallic channels and plugs ("vias"), including various dopants implanted into various materials for producing the electronic functionality desired of the IC. The near-universal trend in the manufacture of integrated circuits is to increase the density of components fabricated onto a given area of wafer, increase the performance and reliability of the ICs, and to manufacture the ICs at lower cost with less waste and fewer defective products generated by the manufacturing process. These goals lead to more stringent geometric and dimensional requirements in the manufacturing process. In particular, etching precise patterns into a layer is facilitated by the layer having a surface as nearly planar as feasible at the start of the patterning process. For the common case of patterning by means of photolithography, a planar surface permits more precise location and dimensioning for focusing the incident radiation onto the surface to be etched than would be possible with a surface having deviations from planarity. Similar conclusions typically apply for electron beam or other means of etching. That is, deviations from planarity of the surface to be etched reduce the ability of the surface to support precisely positioned and precisely dimensioned etches. In the following description of the present invention we focus on the typical etching, planarization and photolithography processes as practiced in the manufacture of ICs. However, this is by way of illustration and not limitation, as those skilled in the art of etching will appreciate that the techniques of the present invention for producing planar surfaces will have applicability in increasing the precision of etching by means other than photolithography. In addition, the present invention is not limited to the field of IC manufacture and may find applicability in other areas of technology requiring planar surfaces.

Chemical Mechanical Planarization ("CMP") has been successfully integrated into integrated circuit multilayer manufacturing processes to achieve highly planar surfaces as described in text books (for example, "Microchip Fabrication" by Peter Van Zant, 3rd Ed., 1997 and "Chemical Mechanical Planarization of Microelectronic Materials" by J. H. Steigerwald, S. P. Murarka and R. J. Gutman, 1997) and generally known in the art. We note that "CMP" is also used in the art to denote "Chemical Mechanical Polishing" as well as "Chemical Mechanical Planarization". We use CMP herein synonymously in either sense without distinction.

A typical CMP process is depicted schematically in FIG. 1. During a CMP process, the wafer, 1, is typically held inside a rotating carrier and pressed onto a rotating pad, 2, under pressure, 6, while an abrasive slurry, 5, (typically containing particles of abrasive such as $SiO_2$, $Al_2O_3$, and the like) flows between the wafer and the pad. The slurry, 5, will typically contain reagents for chemically etching the wafer, 1, leading to chemical as well as mechanical removal of material. Thus, in the typical practice of CMP, material removal is effected by a combination of chemical attack and mechanical abrasion.

Typically, the wafer, 1, will be caused to rotate as depicted by 3 in FIG. 1, while the polishing pad will itself rotate (4 in FIG. 1). FIG. 1 depicts the polishing pad and wafer rotating in the same direction (for example, clockwise when viewed from above as in FIG. 1). However, this is merely for purposes of illustration and counter-rotation of wafer and polishing pad is also practiced. In addition to the rotation of the wafer depicted by 3 in FIG. 1, the wafer, 1, may be caused to oscillate in the plane of the surface being polished, substantially perpendicular to the direction of the applied force, 6 (This oscillatory motion is not depicted in FIG. 1).

Recent work has indicated the ability to planarize surfaces by purely chemical means, without the need for a polishing pad or mechanical contact with the surface undergoing planarization (Ser. No. 09/356,487, incorporated herein by reference). As described in the referenced application, appropriate etchant chemicals are applied to a spinning wafer under conditions and in such a fashion as to planarize the wafer surface. The techniques described in Ser. No. 09/356,487 are collectively denoted as "spin etch planarization" or SEP. Chemical compositions presented in the present application may be employed in SEP processes for the planarization of Cu/Ta/TaN surfaces as well as in more conventional CMP.

Increasing the speed and performance of ICs typically calls for increasing the density of components on the wafer and increasing the speed at which the IC performs its desired functions. Increasing component density typically requires decreasing the size of conducting channels and vias (or plugs). It is well known that decreasing the cross-section of a current-carrying conductor increases the electrical resistance of the conductor for the same material. Thus, decreasing component size on ICs increases electrical resistance, degrading performance and perhaps leading to unacceptable heating. This is one reason IC developers have been looking for conducting materials for use in IC fabrication having lower electrical resistance. Present IC technology typically makes use of tungsten (chemical symbol W) and aluminum (Al) as conductors. Both have adequate electrical conductivities in present devices, but future generations of IC devices will preferably make use of yet higher conductivity materials. Copper (Cu) is among the leading candidates.

Increasing the density of IC components on the wafer also increases the capacitance of the circuits. That is, bringing charge-carrying circuit elements closer together increases the capacitive coupling between such circuit elements. Higher capacitance is detrimental to circuit performance, especially for higher frequency operation as would typically be encountered in telecommunication applications and elsewhere. However, capacitive coupling between proximate circuit elements can be reduced by reducing the dielectric constant of the insulator or insulating material separating the coupled circuit elements. Thus, in addition to seeking conductors with higher conductivities, insulators with lower dielectric constant ("low k") are also being sought for use as insulating layers in ICs.

Current multi-layer IC fabrication typically makes use of tungsten (W) CMP processes at each successive circuit level. Typically, blanket films of W, Titanium (Ti) and Titanium Nitride (TiN) are deposited. The films are then typically polished, thereby removing material resulting in (for example) W vias or "plugs" which are inlaid, typically in an $SiO_2$ dielectric layer. The W plugs act as electrically conducting paths between the metal lines of adjacent layers of the IC. Typically, the metal lines connected by W vias will consists of alloys of Al and Cu in present ICs. In typical present IC designs, Ti and TiN layers are used as barrier layers (to hinder unwanted diffusive intermixing of components during fabrication) and adhesion layers (to promote good bonding between otherwise poorly bound layers and to avoid delamination). Such barrier and adhesion layers must also be removed during W CMP to reveal the inlaid W plugs. Desirable CMP for such ICs should remove the various layers equally and, thus, planarize in one CMP step. Commercially available W slurries can achieve almost the ideal 1:1 removal rate selectivity between W and Ti/TiN layers. This results in a very flat surface of the device wafers after W CMP. Thus, if other combinations of conductor and insulators are to be used in IC fabrication, adequate chemical reagents for CMP must be employed and adequate planarization processes must be used. Such are among the objects of the present invention.

The use of W vias, Al—Cu lines, and $SiO_2$ dielectric layers, although quite successful in present ICs, has inherent drawbacks that hinder attaining the circuit performance desired in future devices. The Al—Cu alloys and W vias are conductive, but less so than Cu. The $SiO_2$ dielectric layers (although good electrical insulators) have a relatively high dielectric constant, leading to deleterious capacitive effects. ("High k" typically denotes dielectric constants in the range of approximately 3 to 9.) The combination of relatively high resistivity metals and relatively high dielectric constant insulators reduces circuit speed and reliability, particularly as the device geometry is reduced in future ICs below approximately 0.25 $\mu$m, (that is 0.25 microns).

Several candidate low k materials for IC dielectric layers include materials having a high degree of porosity. The open structure of such porous materials includes significant amount of airspace. Therefore, in determining the overall effective dielectric constant of the material, lower k values are achieved. However, conventional CMP of porous materials is complicated by the possibility of abrasive CMP particles becoming entrapped in the porous structure. Subsequent cleaning to remove these entrapped abrasive particles from the IC adds to the processing complexity and to the IC cost. Some embodiments of present invention describe a CMP solution without abrasive particles. Thus, when used in connection with porous dielectric materials, these CMP solutions of the present invention offer the advantage of not requiring post-CMP cleanup for removing entrapped abrasives.

Metallic copper (Cu) has a lower resistivity than W or Al—Cu alloys. Therefore, Cu is becoming a popular choice for the interconnect metal to be used in future generation ICs. It is further envisioned that low k dielectric materials (that is, materials with dielectric constants, k, less than about 3.0) will be used in conjunction with Cu metallization to reduce capacitive effects. However, both of these choices bring accompanying challenges in the fabrication of high performance, low cost, reliable ICs. Low k dielectrics are often mechanically weak relative to conventional dielectrics and tend to delaminate under the stress of CMP, especially if the applied pressure, 6, in FIG. 1 must be rather large in order to achieve adequate material removal rates. An adequate rate of material removal is required in order to achieve planarization in an acceptable period of time. Addressing these challenges, the focus of the present invention is on the use of copper, on barrier layers to avoid harmful diffusion of Cu, and slurry compositions for effective Cu CMP (or non-contact planarization also known as "spin-etch planarization" or "SEP") in the presence of effective barrier and adhesion layers. Typical barrier layers in copper damascene or dual damascene fabrication processes include Ta and TaN.

In order to increase performance and reduce manufacturing costs, it is envisioned that Cu metal will most likely be used in future ICs in fabricating the metallic conducting channels within a layer and in the vias which connect adjacent layers. This will likely be accomplished using a "damascene" or "dual damascene" manufacturing approach. Damascene processing typically proceeds by depositing a blanket layer of metal on top of a patterned insulating or dielectric layer, thereby filling channels and vias in the patterned insulating layer. When necessary, the metal deposition is preceded by the deposit of a barrier or adhesion layer between the metal and the dielectric. Since trench and via filling is not typically uniform, the metal is deposited to fill the features and covers the field regions between features as well. This blanket metal overlayer is then typically removed by CMP or etching, revealing the inlaid metal channels and vias with a surface ideally coplanar with the field regions of the surrounding dielectric. The barrier layer on the field region is also typically removed in the planarization step. Dual damascene is a two-step damascene process, typically forming more than one layer of features in the dielectric before barrier layer and metal is deposited.

It is envisioned that the metal of choice for the next generations of ICs will be copper. Therefore, to be concrete in our description, we will describe the practice of the present invention in connection with copper damascene or dual damascene processing including the use of Ta/TaN barrier layers. However, the present invention is not inherently so limited and other embodiments will be obvious to those having ordinary skills in the art.

Copper has the advantage of higher conductivity, but suffers from several complications which heretofore have delayed its adoption in ICs. Among copper's disadvantages is the fact that it is a very diffusive contaminant. That is, copper diffuses widely and easily through other materials typically used in the fabrication of ICs, seriously degrading electronic performance by doing so. It is among the objects of the present invention to address, eliminate or ameliorate some of these attendant drawbacks in the use of Cu metallization in the fabrication of ICs.

In addition to its high rate of diffusion, reaction products of copper with typical etching reagents have often resulted in non-volatile (or insoluble) reaction products. Thus, etching of Cu with conventional CMP slurries has been difficult. Identification of a group of effective copper etching reagents having volatile or soluble reaction products (while maintaining adequate removal rate and selectivity) is among the objectives of the present invention.

Tantalum (Ta) and Tantalum Nitride (TaN) have been identified as promising barrier layer, or "liner metals", that will prevent harmful Cu diffusion. Because CMP is presently the most effective and well understood planarization technique, it is the natural method with which to undertake the planarization of Cu, Ta or TaN. Such Cu/Ta/TaN CMP requires slurries with high Cu and Ta/TaN removal rates and close to a 1:1 removal selectivity between Cu and the liner metals. However, Ta and TaN are mechanically hard and they do not react readily with most etching chemicals. For these reasons, CMP slurries having appropriate chemical formulations to obtain 1:1 selectivity between Cu and the liner metals have been difficult to achieve. Hence, at present there is no slurry commercially available for Cu CMP.

Typical experimental Cu slurries are composed of $H_2O_2$, various oxidizers, alumina and/or silica abrasive, and other chemical components, typically in acidic (low pH) solutions. (Tytgat et. al. U.S. Pat. Nos. 4,981,553; 5,098,571). These formulations typically give good Cu removal rate, but often achieve very low Ta/TaN removal rates, even when high polishing pressures are employed. Currently there are two common experimental approaches being employed for Cu CMP, both of which suffer from disadvantages. In one approach (Brusic, "A Cautious Approach to the Removal of Ta in the CMP Polishing of Cu/Ta Structures", $193^{rd}$ Electrochemical Society Meeting, May 1998) Cu CMP is conducted by using a two-step polishing process to remove Cu and Ta/TaN. The Cu and Ta/TaN layers are removed separately in sequence using two distinct slurries. This two step approach significantly complicates the fabrication processes and increases the cost of the CMP process applied to Cu. A single-step Cu CMP would be preferable, but it would require a slurry with 1:1 selectivity for Cu and Ta/TaN. One possible way to increase the removal rate of Ta/TaN layers is to dramatically increase the polishing downforce. However, a higher polishing downforce is contraindicated since it could damage the underlying low k materials, which are often mechanically weak and subject to delamination. Achieving a slurry with the required near 1:1 selectivity without the application of large polishing downforce is among the objects of the present invention.

Slurry formulations that react chemically with inert liner metals to achieve adequate removal rates and selectivity would be an improvement in Cu CMP. A single-step Cu CMP employing a slurry that provides 1:1 selectivity and high material removal rates at low polishing pressures, is highly desirable. However, a two-step CMP slurry that did not require high polishing pressures, though less desirable than the single-step slurry, would still be an improvement in the present art.

The present invention is described for the specific example of CMP slurries for Cu/Ta/TaN on IC wafers as this specific case is expected to be a primary area of applicability of the present invention. However, the compositions and processes of the present invention are not inherently limited to these particular instances. The present invention could be useful for processing many different types of metallic, dielectric, or organic layers, or mixtures and/or composites thereof, on numerous types of substrate for numerous technical applications, as would be known to those skilled in the art. In addition, etchant formulations that may be used in connection with non-contact CMP (or SEP) are described.

BRIEF SUMMARY OF THE INVENTION

Chemical mechanical planarization of surfaces of copper, tantalum and tantalum nitride is accomplished by means of the chemical formulations of the present invention. The chemical formulations may optionally include abrasive particles and such abrasive particles may be chemically reactive or inert. Contact or non-contact CMP may be performed with the present chemical formulations. Substantially 1:1 removal rate selectivity for Cu and Ta/TaN is achieved. In addition to 1:1 removal rate selectivity, the present invention provides adequate material removal rates without excessive downforce being necessary on (often delicate) low dielectric components. Etchant formulations of the present invention are also applicable for use with spin etch planarization.

BRIEF DESCRIPTION OF THE SEVERAL VIEWS OF THE INVENTION

FIG. 1: Schematic depiction of Chemical Mechanical Planarization ("CMP").

DETAILED DESCRIPTION OF THE INVENTION

In the following description and figures, similar reference numbers are used to identify similar elements. For economy of language we use "CMP" to denote both chemical mechanical planarization in which a polishing pad is used ("contact CMP") as well as non-contact CMP in which no polishing pad is used. SEP is included within this usage of CMP as a type of non-contact CMP.

The Cu/Ta/TaN CMP slurries, or "etchants", described herein are improved formulations of chemicals typically used for CMP including abrasive slurries, metal etchants and cleaners, chemical polishes, brighteners, and pickling solutions, etc. Conventional (contact) CMP typically includes abrasive particles in the etchant formulation, abrasives are typically not present in non-contact CMP. Etchants with and without abrasive particles are within the scope of the present invention. The chemical compositions of the etchant include chemical mixtures, typically comprised of one or more of the following constituents:

TABLE A

Abrasive Particles
Mineral Acids
Organic Acids
Strong Bases
Mineral Salts
Organic Salts
pH buffers
Oxidizing Agents
Organic and Inorganic Peroxides
Corrosion Inhibitors
Chelating Agents
Surface Modifying Agents
Liquid polymers
Surfactants
Solution Stabilizers
Solvents (including water)

In general, CMP use of the etchants described herein requires a method of introducing the etchant onto the wafer surface and preferably a method for transporting the etchant across the wafer surface. The polishing pad and process depicted in FIG. 1 is the typical mechanism used in contact CMP. However, the CMP chemical formulations of the present invention need not include abrasives in the etchant mixture and do not necessarily require mechanical contact between the wafer surface and another surface or body, such as a polishing pad. Thus, the etchants of the present invention may be used to good effect in both contact and non-contact CMP, but require different transport mechanisms (such as SEP) than the polishing pad depicted in FIG. 1.

In addition to adjusting the type and concentration of etchant constituents, heating the etchant solution may be used to control the removal and rate of removal of material from the surface of the wafer. Temperature control of the reaction may be achieved by introducing the etchant onto the wafer preheated to the desired temperature, by heating the polishing pad other body and/or by maintaining the polishing at a constant temperature.

Improved CMP is achieved by means of etching solutions as described below. Abrasive particles are optionally included and may optionally react with the surface of the wafer being etched as well as provide mechanical removal of wafer material. Many suitable abrasive materials could be used, including conventional abrasives ($SiO_2$, $Al_2O_3$ and the like), and various nonconventional abrasives that are comprised of metals, solid elemental particles (for example carbon), polymer particles, oxides, carbides, fluorides, carbonates, borides, nitrides, or hydroxides of several metals, including, but not limited to, Al, Ag, Au, Ca, Ce, Cr, Cu, Fe, Gd, Ge, La, In, Hf, Mn, Mg, Ni, Nd, Pb, Pt, P, Sb, Sc, Sn, Tb, Ti, Ta, Th, Y, W, Zn, Zr, or mixtures thereof. These particles may be coated with a thin layer of another material, including but not limited to those described above. The potential advantages of the use of coated particles are expected to include decreasing cost by coating a less dense, inactive and inexpensive particle, such as $SiO_2$, with a chemically active, and often more dense and expensive active material such as $CeO_2$. The effective density of such particles will be less than solid particles comprising all chemically reactive material, and thus more stable in terms of particle settling according to Stokes Law which predicts a larger settling velocity for particles having a higher density. Similarly for a given wt % of solids, slurries comprised of coated abrasive particles (typically less dense) will have a greater number of particles in a given volume of fluid and thereby present a greater abrasive surface area in contact with the wafer surface.

It is envisioned in the practice of the present invention that many of the particle systems described herein will be produced by means of the "sol" method. This typically involves growing the particles to their final size in solution. By growing the particles entirely in solution and remaining in solution for use (that is, never dried) there is no sintering or "necking" of the particles that will result in large agglomerate, which may be damaging to the sensitive IC layers, or underlying structures. Having avoided agglomeration, these particles are introduced into solvent systems very readily and at lower cost than conventional abrasives that typically must undergo additional and expensive particle size reduction and powder dispersion processing. The practice of the present invention makes use of several particle size distributions. A bi-modal particle size distribution, or a multi-modal particle size distribution, or a broad Gaussian particle size distribution, may all be employed in the practice of the present invention with typical particle sizes in the range 4 nm to 5 $\mu$m. It is envisioned in the practice of the present invention that particle sizes greater than approximately 5 $\mu$m will not give satisfactory results, particularly in terms of increasing removal rates and reducing defects and scratches.

We note elsewhere herein typical components of the etching reagents useful in the practice of the present invention. Practical industrial applications may also require the reagent mixture to contain other additives to inhibit premature reaction, stabilize the mixture, increase shelf life of the reagent mixture, reduce volatility, inhibit toxicity, inhibit photodegradation, and the like. Such additives are known to those skilled in the art and art not otherwise specified in detail herein.

Tables 1–13 following are examples of reagent mixtures usefully employed in the practice of the present invention for planarizing copper surfaces or other surfaces as indicated on the Tables.

TABLE 1

AQUEOUS PEROXIDE - PHOSPHORIC ACID REAGENT SOLUTIONS FOR PLANARIZATION OF COPPER

| Oxidizer | Co-Reactant | Other Additives |
| --- | --- | --- |
| a) $H_2O_2$ | $H_3PO_4$ | HCl, aliphatic alcohols |
| b) $H_2O_2$ | $H_3PO_4$ | HCl, Agidol (butylated hydroxytoluene) |
| c) $H_2O_2$ | $H_3PO_4$ | HCl, Agidol-2, |
| d) $H_2O_2$ | $H_3PO_4$ | HCl, 2,6-di-tert-butyl-4[(dimethylamino)methyl]phenol |
| e) $H_2O_2$ | $H_3PO_4$ | HCl; $H_3PO_4$, $(HPO_4)^{2-}$, $PO_4^{3-}$ |
| f) $H_2O_2$ | $H_3PO_4$ | HCl, 2,6-di-tert-4N,N-dimethyl aminomethylphenol |
| g) $H_2O_2$ | $H_3PO_4$ | borax |
| h) $H_2O_2$ | $H_3PO_4$ | various additives |

TABLE 2

AQUEOUS PEROXIDE - SULFURIC ACID REAGENT SOLUTIONS FOR PLANARIZATION OF COPPER

| Oxidizer | Co-Reactant | Other Additives |
| --- | --- | --- |
| a) $H_2O_2$ | $H_2SO_4/H_3PO_4$ | Ethylene glycol, $ZnSO_4$ |
| b) $H_2O_2$ | $H_2SO_4$ | MeOH, Poly(oxy ethylene)lauryl ether, Malic acid |
| c) $H_2O_2$ | $H_2SO_4$ | $HOOC(CX_2)_nCOOH$ with X = OH, amine, H n = 1–4 |
| d) $H_2O_2$ | $H_2SO_4$ | 3% tartaric acid 1% ethylene glycol |
| e) $H_2O_2$ | $H_2SO_4$ | 1,2,4-triazole, 1,2,3-triazole, tetrazole, nonionic surfactant |
| f) $H_2O_2$ | $H_2SO_4$ | $C_2H_5OH$, aliphatic alcohols, nonionic surfactant |
| g) $H_2O_2$ | $H_2SO_4$ | Triflouroethanol, Laprol 602 ® surfactant, aliphatic alcohols |
| h) $H_2O_2$ | $H_2SO_4$ | aliphatic alcohols |
| i) $H_2O_2$ | $H_2SO_4$ | $SiF_6$, Organic salt surfactant |
| j) $H_2O_2$ | $H_2SO_4$ | various additives |

TABLE 3

AQUEOUS PEROXIDE MINERAL ACID REAGENT SOLUTIONS FOR PLANARIZATION OF COPPER

| Oxidizer | Co-Reactant | Other Additives |
| --- | --- | --- |
| a) $H_2O_2$ | $HNO_3$ | alcohols, $HOOC(CX_2)_nCOOH$ X = OH, amines, H n = 1–4 |
| b) $H_2O_2$ | $HNO_3$ | various additives |

TABLE 4

AQUEOUS NITRIC ACID REAGENT SOLUTIONS FOR PLANARIZATION OF COPPER

| Oxidizer | Co-Reactant | Other Additives |
|---|---|---|
| a) $H_2O_2/HNO_3$ | $H_3PO_4$ | methanol |
| b) $H_2O_2/HNO_3$ | | Triflouroethanol, Laprol 602 ® Surfactant, aliphatic alcohols |
| c) $HNO_3$ | $H_3PO_4$ | PVA |
| d) $HNO_3$ | $H_2SO_4$ | diphenylsulfamic acid, aliphatic alcohols |
| e) $HNO_3$ | $H_2SO_4$ | HCl |
| f) $HNO_3$ | $H_2SO_4$ | various additives |
| g) $HNO_3$ | | BTA (benzotriazole) |

TABLE 5

AQUEOUS PEROXIDE ORGANIC ACID REAGENT SOLUTIONS FOR PLANARIZATION OF COPPER

| Oxidizer | Co-Reactant | Other Additives |
|---|---|---|
| a) $H_2O_2$ | Oxalic acid | Sodium oxalate, Benzotriazole, Sodium Lignosulfonate |
| b) $H_2O_2$ | other organic acids | various additives |

TABLE 6

AQUEOUS DILUTE MINERAL ACID REAGENT SOLUTIONS FOR PLANARIZATION OF COPPER

| Acid | Other Additives |
|---|---|
| a) $H_3PO_4$ | various additives |

TABLE 7

AQUEOUS CONCENTRATED ACID REAGENT SOLUTIONS FOR PLANARIZATION OF COPPER

| Oxidizer | Acids | Other Additives |
|---|---|---|
| a) NI | $H_3PO_4$/Acetic/$H_2SO_4$ | |
| b) NI | $H_3PO_4$/Acetic/$HNO_3$ | |
| c) NI | $H_3PO_4$/Acetic/$HNO_3$/$H_2SO_4$ | Glycol, Gelatine Carboxymethylcellulous, amines, surfactants, heavy metal salts including Cu and Ta. |
| d) $H_2O_2$ | $H_3PO_4$/Acetic/$H_2SO_4$ | Glycol, Gelatine Carboxymethylcellulous, amines, surfactants, heavy metal salts including Cu and Ta. |
| e) $H_2O_2$ | $H_3PO_4$/$H_2SO_4$ | 100 ml propylene glycol, 100 ml 2-ethylhexylamine, 25 ppm $Cl^-$. |
| f) NI | $H_3PO_4$/Acetic/$HNO_3$ | nonionic surfactant |
| g) $H_2O_2$ | $H_3PO_4$/Acetic/$HNO_3$/$H_2SO_4$ | various additives |
| h) NI | $H_3PO_4$/$HNO_3$ | |

"NI" indicates that a distinct oxidizing component is not include in this formulation, its function being served by one or more of the acid.

TABLE 8

AQUEOUS DILUTE ACID - METAL SALT REAGENT SOLUTIONS FOR PLANARIZATION OF COPPER

| Oxidizer | Acid | Metal Salt | Other Additives |
|---|---|---|---|
| a) | HCl | CuCl | |
| b) | HCl | CuCl | KCl |
| c) | HCl | FeCl | various additives |
| d) $H_2O_2$ | $H_2SO_4$ | CuCl | n-propanol |
| e) | HCl | CuCl | various additives |
| f) $H_2O_2$ | $H_2SO_4$ | CuCl | various additives |
| g) | HCl | $FeCl_3$ | glycerol |
| h) $HNO_3$ | HCl | $FeCl_3$ | |
| i) | HCl | $FeCl_3$ | |
| j) | HCl | $FeCl_3$ | various additives |
| k) | HCl | $FeCl_3$ | $CuCl_2$, $SnCl_2$ |
| l) | HCl | $FeCl_3$ | ethanol |

TABLE 9

AQUEOUS OXIDIZER - SALT REAGENT SOLUTIONS FOR PLANARIZATION OF COPPER

| Oxidizer | 2nd Oxidizer | Base | Salt | Other Additives |
|---|---|---|---|---|
| a) $NaClO_3$ | | $NH_4F$ | $CuSO_4$ | Na EDTA salt of wetting agent |
| b) $FeNO_3$ | | | | various additives |
| c) $(NH_4)_2S_2O_8$ | | | | various additives |
| d) $CuNH_4Cl_3$ | | $NH_4OH$ | | various additives |
| e) $Na_2S_2O_3$ | $K_2S_2O_5$ | | | various additives |

TABLE 10

AQUEOUS BASE REAGENT SOLUTIONS FOR PLANARIZATION OF COPPER

| Base | Oxidizer | Other Additives |
|---|---|---|
| a) $NH_4OH$/KOH | $H_2O_2$ | various additives |
| b) $NH_4OH$ | $H_2O_2$ | various additives |
| c) $NH_4OH$ | $(NH_4)_2S_2O_8$ | various additives |
| d) $NH_4OH$ | | $Cu(NO_3)_2$ |

TABLE 11

AQUEOUS ACID REAGENT SOLUTIONS FOR PLANARIZATION OF TANTALUM AND COPPER

| Oxidizer | Acid | Other Additives |
|---|---|---|
| a) $HNO_3$ | HF | various additives |
| b) $H_2O_2$ | HF | various additives |
| c) $HNO_3$ | HF | lactic acid, various additives |
| d) $H_2O_2$ | HF | $H_2SO_4$ |

TABLE 12

AQUEOUS BASE REAGENT SOLUTION FOR PLANARIZATION OF TANTALUM AND COPPER

| Base | Acid | Other Additives |
|---|---|---|
| a) NaOH | | |
| b) NaOH | $H_2O_2$ | |
| c) KOH | $H_2O_2$ | |
| d) $NH_4OH$ | $H_2O_2$ | |

Remove oxide film after CMP with rinse of dilute acetic acid, dilute nitric acid, aqueous solution or other solutions.

TABLE 13

MISCELLANEOUS REAGENTS FOR PLANARIZATIONS OF COPPER a) EDTA, $NH_4OH$, $H_2O_2$, in aqueous solution
b) Citric acid, Erythorbic acid, Triethanolamine, in aqueous solution
c) Trisodium citrate, Triethanolamine, Sodium nitrate, in aqueous solution
d) $H_2SO_4$, $H_2O_2$, Sodium molybdate, Phenosulfonic acid, in aqueous solution
e) Mineral acid (sulfuric, HCl or the like), molybdenum salt In addition to the additives shown in Tables 1–13 above, other additives include but are not limited to the following:

borax, zinc sulfate, copper carbonate, alcohol (including low molecular weight alcohols, glycols, phenols, aliphatic alcohols, polyvinylalcohols and the like), surfactants (including anionic, cationic, nonionic surfactants and others preferentially adhering to certain materials, modifying thereby the chemical reactivity of certain sites), solution stabilizers (including polyvinyl alcohols and other agents inhibiting spontaneous decomposition of oxidizing agents), wetting agents.

For example, one specific formulation uses highly concentrated $H_2O_2$ in a strong base, such as KOH, plus chemical-active abrasive particles such as $CeO_2$ or $SnO_2$, in conjunction with other chemical components. According to Tytgat (U.S. Pat. No. 4,981,553), the chemical etchant alone (without abrasion) provides a Ta removal rate of approximately 1000–2000 Ångstrom/min., which is significantly higher than Ta removal rates typically available Cu slurries. The present invention may be expected to achieve increased Ta removal rates in CMP by employing the additional mechanism of mechanical abrasion of the wafer by abrasive particles. In addition, heating the slurry, or the opposing body or pad, could enhance the removal rate of the Ta or TaN layers. Thus temperature control may be another means of achieving a low polishing pressure CMP process.

EXAMPLES

Example A 50 parts by volume $H_3PO_4$
40 parts by volume Acetic Acid
10 parts by volume $HNO_3$
All acids are fully concentrated aqueous solutions.

The formulation of Example A yields a Cu removal rate of approximately 15,000 Å/min. when SEP is performed and a surface roughness (RMS) less than approximately 100 Å. In addition, this composition planarizes topography approximately 3000 Å in height (bumps) and features more than 2.5 μm wide to an 80% degree of planarity (that is, 80% height reduction).

Example B 70 parts by volume $H_3PO_4$
24 parts by volume Acetic Acid
6 parts by volume $HNO_3$
All acids are filly concentrated aqueous solutions.

The formulation of Example B yields a Cu removal rate of approximately 15,000 Å/min. when SEP is performed. Final roughness (root-mean-square) is less than approximately 70 Å.

Example C 50 parts by volume $H_3PO_4$
40 parts by volume Acetic Acid
3 parts–10 parts by volume $HNO_3$
All acids are fully concentrated aqueous solutions.

The formulation of Example C yields a Cu removal rate in the range from approximately 3,000 Å/min to approximately 20,000 Å/min. when SEP is performed. The rate of Cu removal is approximately proportional to the nitric acid content.

Example D 50 parts by volume $H_3PO_4$
40 parts by volume Acetic Acid
3 to 10 parts by volume $HNO_3$
1 to 15 parts by volume HF
All acids are fully concentrated aqueous solution.

Having described the invention in detail, those skilled in the art will appreciate that, given the present disclosure, modifications may be made to the invention without departing from the spirit of the inventive concept described herein. Therefore, it is not intended that the scope of the invention be limited to the specific and preferred embodiments illustrated and described.

We claim:

1. An etching solution for the planarization of a Cu/Ta/TaN surface comprising:

an oxidizing reactant selected from the group consisting of $H_2O_2$, $HNO_3$ and mixtures thereof; and, a co-reactant is selected from the group consisting of $H_3PO_4$, $H_2SO_4$, $HNO_3$, oxalic acid, acetic acid, organic acids and mixtures thereof; and, other additives comprising of HCl, aliphatic alcohols, butylated hydroxytoluene, Agidol-2,2,6-di-tert-butyl-4[(dimethylamino)methyl]phenol, 2,6-di-tert-4N,N-dimethylaminomethyiphenol, borax, ethylene glycol, $ZnSO_4$, methanol, propanol, poly(oxyethylene)lauryl ether, malic acid, $HOOC(CX_2)_nCOOH$ wherein X=OH, amine, H and n=1–4), 3% tartaric acid, 1% ethylene glycol, 1,2,4-triazole, 1,2,3-triazole, tetrazole, nonionic surfactant, ethanol, triflouroethanol, $SiF_6$, organic salt surfactant, polyvinyl alcohol, diphenylsulfamic acid, sodium oxalate, bezotriazole, sodium lignosulfonate, glycol, gelatin carboxymethylcellulose, amines, heavy metal salts, salts of Cu and Ta, KCl, $CuCl_2$, $SnCl_2$, propylene glycol, 2-ethylhexylamine, copper carbonate, low molecular weight alcohols, glycols, phenols, aliphatic alcohols, polyvinylalcohols, anionic surfactants, cationic surfactants, fluorocarbon-based surfactants, nonionic surfactants having the properties of preferentially adhering to certain materials, modifying thereby the chemical reactivity where so adhered, polyvinyl alcohol solution stabilizers and species inhibiting spontaneous decomposition of oxidizing agents, wetting agents and mixtures thereof; and abrasive particles comprising $SiO_2$, $Al_2O_3$ metallic and solid elemental particles, polymer particles, oxides, carbides, fluorides, carbonates, borides, nitrides, hydroxides of Al, Ag, Au, Ca, Ce, Cr, Cu, Fe, Gd, Ge, La, In, Hf, Mn, Ng, Ni, Nd, Pb, Pt, P, Sb, Sc, Sn, Th, Ti, Ta, Th, Y, W, Zn, Zr, and mixtures thereof, wherein the particles have a size less than approximately 5 micrometers.

2. An etching solution for the planarization of a Cu/Ta/TaN surface as in claim 1 further comprising abrasive particles selected from the group consisting $SiO_2$, $Al_2O_3$ metallic and solid elemental particles, polymer particles, oxides, carbides, fluorides, carbonates, borides, nitrides, hydroxides of Al, Ag, Au, Ca, Ce, Cr, Cu, Fe, Gd, Ge, La, In, Hf, Mn, Mg, Ni, Nd, Pb, Pt, P, Sb, Sc, Sn, Tb, Ti, Ta, Th, Y, W, Zn, Zr, and mixtures thereof.

3. An etching solution as in claim 1 wherein said abrasive particles are coated.

4. An etching solution as in claim 2 wherein said coating is $CeO_2$.

5. An etching solution as in claim 1 wherein said coating is $CeO_2$.

6. An etching solution as in claim 1 wherein said particles are produced by the sol method.

7. An etching solution as in claim 1 wherein said particles have a range of sizes from approximately 4 nanometers to approximately 5 micrometers.

8. An etching solution for the planarization of a Cu/Ta/TaN surface comprising
   a) from approximately 50 parts by volume to approximately 70 parts by volume of concentrated aqueous $H_3PO_4$; and,
   b) from approximately 24 parts by volume to approximately 40 parts by volume of concentrated aqueous acetic acid; and,
   c) from approximately 3 parts by volume to approximately 10 parts by volume of concentrated aqueous $HNO_3$.

* * * * *